United States Patent [19]

Edwards et al.

[11] Patent Number: 4,498,059
[45] Date of Patent: Feb. 5, 1985

[54] CIRCUIT TO MINIMIZE LOCAL CLOCK FREQUENCY DISTURBANCES WHEN PHASE LOCKING TO A REFERENCE CLOCK CIRCUIT

[75] Inventors: Ivan L. Edwards, Westmont; Robert C. McLaughlin, Bloomingdale; Max S. Macrander, Warrenville, all of Ill.

[73] Assignee: GTE Automatic Electric Incorporated, Northlake, Ill.

[21] Appl. No.: 507,437

[22] Filed: Jun. 23, 1983

[51] Int. Cl.³ .............................................. H03L 7/10
[52] U.S. Cl. .................................... 331/1 A; 331/14; 331/17; 331/27
[58] Field of Search ................... 331/1 A, 17, 25, 27, 331/14

[56] References Cited

U.S. PATENT DOCUMENTS

| | | | |
|---|---|---|---|
| 4,151,485 | 4/1979 | La Fratta | 331/1 A |
| 4,305,045 | 12/1981 | Metz et al. | 331/1 A |
| 4,450,518 | 5/1984 | Klee | 331/1 A X |

Primary Examiner—Siegfried H. Grimm
Attorney, Agent, or Firm—Gregory G. Hendricks; Robert J. Black

[57] ABSTRACT

A frequency disturbance minimization circuit for use in a phase locked loop circuit. A pulse generator eliminates random phase shift, which occurs after a reference clock outage, by synchronizing counted down derivatives of the local and reference clock circuits. A window circuit provides a signal representative of the difference in phase between these local and reference clock circuits. A counter accumulates these phase difference window signals for periodic interrogation by a microprocessor which causes a voltage controlled oscillator to adjust its frequency in the direction necessary to eliminate this phase difference.

30 Claims, 1 Drawing Figure

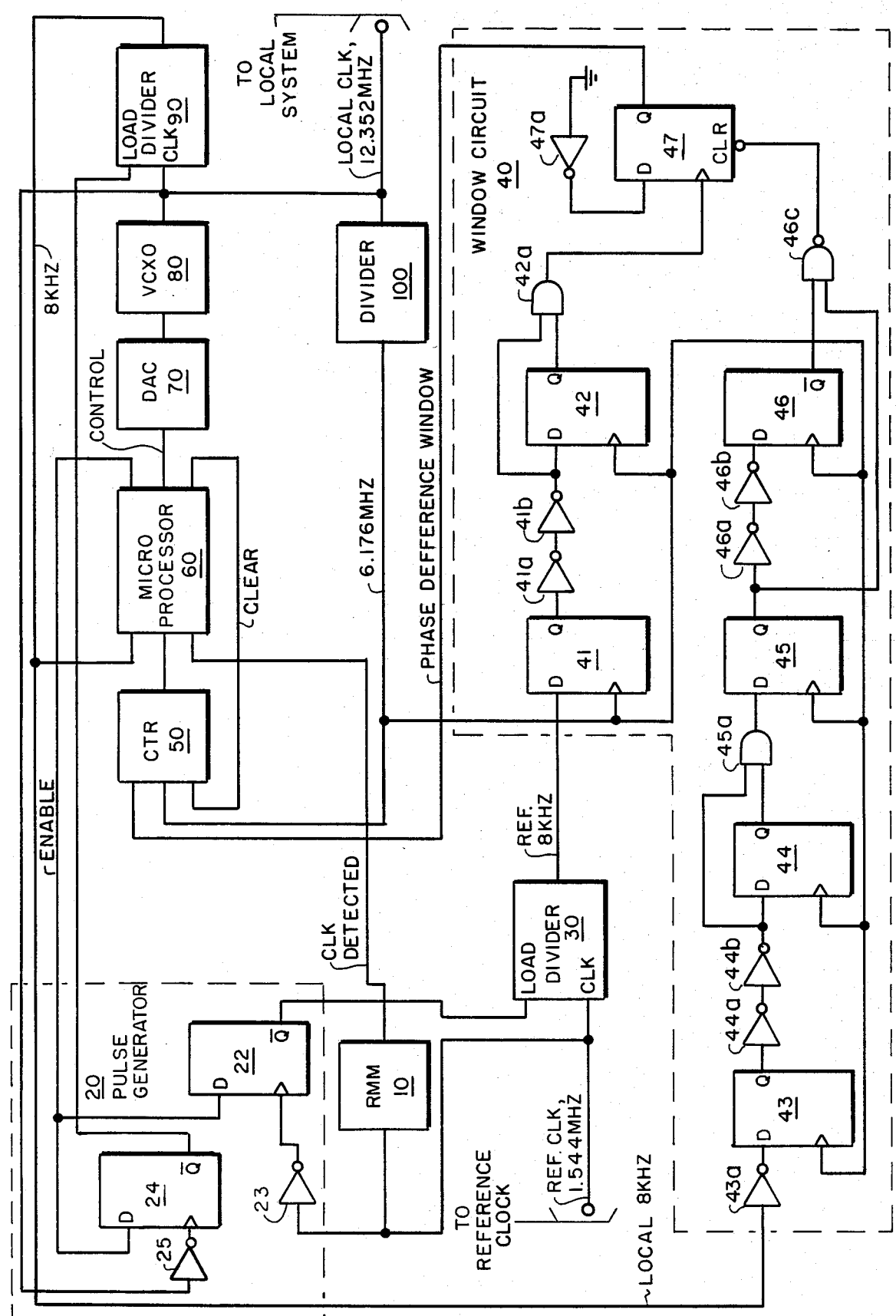

CIRCUIT TO MINIMIZE LOCAL CLOCK FREQUENCY DISTURBANCES WHEN PHASE LOCKING TO A REFERENCE CLOCK CIRCUIT

CROSS REFERENCE TO RELATED APPLICATION

Co-pending and concurrently filed U.S. patent applications, Ser. Nos. 507,427 and 507,436 are related to the present application. The inventions claimed in all of these applications have the same title and they were all invented by the same inventors and assigned to the same assignee.

FIELD OF THE INVENTION

The present invention relates to phase locked loop circuits and more particularly to a circuit for minimizing local clock frequency disturbances when phase locking a local clock circuit to a reference clock circuit.

BACKGROUND OF THE INVENTION

Phase locked loop circuits are old and well known. Typically these circuits include analog phase comparators which achieve phase locking when the reference signal returns after having been interrupted for some period of time. These circuits cause severe local clock frequency disturbances during the phase locking process.

A circuit which does operate to minimize this local clock frequency disturbance is disclosed in U.S. Pat. Nos. 4,305,045 issued to R. Metz et al on Dec. 8, 1981. In this circuit, the microprocessor which performs the phase comparison, determines the amount of random phase shift which has occured. Then it calculates a five bit word, based on that phase shift, which is used to correct the phase shift. This five bit word is applied to a five bit register which is extensively interconnected with a counter chain which counts down the reference signal.

The five bit word generated by the microprocessor, acts via the register and counter chain circuitry, and dynamically alters the phase of the counted down reference signal to minimize the phase difference between the counted down local and reference signals. However, in this arrangement, complex circuitry and microprocessor calculations are required to perform the phase minimization.

SUMMARY OF THE INVENTION

In accordance with the present invention, a clock signal phase locking arrangement is provided for use in a switching signal which includes a source of reference clock signals. The phase locking arrangement includes a control circuit which is operative to provide a plurality of local clock frequency control signals. The control circuit is connected to the reference clock signal source and it is further operative in response to an absence of the reference clock signals for a predetermined time to maintain the local clock frequency control signal in its current state. A local clock circuit is connected to the control circuit and it is operative in response to the plurality of local clock frequency control signals to provide a plurality of local clock signals, each having a frequency associated with one of said control signals. The control circuit is further operative in response to detection of the reference clock signals after their absence to generate a synchronization signal. A first frequency divider is connected to the source of reference clock signals and the control circuit, and it is operative in response to the synchronization signal to provide counted down reference clock signals of a first frequency. A second frequency divider is connected to the local clock circuit and the control circuit, and it is operative in response to the synchronization signal to provide counted down local clock signals of the first frequency. A phase difference measurement circuit is connected to the first and second frequency dividers, and the control circuit, and it is operative in response to the counted down reference clock signals and the counted down local clock signals to provide a phase difference signal representative of the phase difference between each of the counted down reference clock signals and an associated one of the counted down local clock signals. The control circuit is further operative in response to each of the phase difference signals to provide an associated one of the control signals of a characteristic representative of the duration of the phase difference signal, whereby the frequency of the local clock circuit is adjusted to eliminate the difference in phase between the counted down local clock signals and the counted down reference clock signals.

DESCRIPTION OF THE DRAWING

The single FIGURE of the accompanying drawing is a schematic diagram of the frequency disturbance minimization circuit of the present invention.

DESCRIPTION OF THE PREFERRED EMBODIMENT

Referring now to the accompanying drawing, the phase locked loop frequency disturbance minimization circuit of the present invention is shown.

This circuit is connected to a reference clock circuit via a REF CLK lead and to the local system via the LOCAL CLK lead. The REF CLK lead is further connected to retriggerable monostable multivibrator (RMM) 10, pulse generator 20 and divider 30. The output of pulse generator 20 is connected to divider 30, which is connected to window circuit 40, and to divider 90 which is connected to microprocessor 60, and window circuit 40. The output of window circuit 40 is connected to counter 50. The output of both this counter and RMM 10 are connected to microprocessor 60 which is further connected to counter 50. The ENABLE output of microprocessor 60 is connected to pulse generator 20 and the CONTROL output of this microprocessor is connected to digital-to-analog converter (DAC) 70 which is connected to voltage controlled oscillator (VCXO) 80. The output of this oscillator is connected to dividers 90 and 100 and to pulse generator 20. Divider 100 is connected to counter 50 and window circuit 40.

Pulse generator 20 includes D-type flip-flop 22 whose data (D) input is connected to microprocessor 60 via the ENABLE signal lead. The clock input of this flip-flop is connected to the reference clock circuit via inverter 23 and the $\overline{Q}$ output is connected to the LOAD input of divider 30. The D input of D-type flip-flop 24 is also connected to microprocessor 60 via the ENABLE signal lead. The clock input of this flip-flop is connected to the local clock circuit via inverter 25 and the $\overline{Q}$ output is connected to the LOAD input of divider 90.

Window circuit 40 includes D-type flip-flop 41 whose D input is connected to divider 30 via the REF (reference) 8 KHz lead. The clock input of D-type flip-flops 41–46 are connected to a 6.176 MHz lead from divider 100. The D input of flip-flop 42 is connected to the Q output of flip-flop 41 via inverters 41a and 41b. The D input and Q output of flip-flop 42 are connected to AND gate 42a which is connected to the clock input of D-type flip-flop 47. The D input of this flip-flop is connected to ground via inverter 47a. The D input of flip-flop 43 is connected to divider 90 via inverter 43a and the LOCAL 8 KHz lead. The Q output of flip-flop 43 is connected to the D input of flip-flop 44 via inverters 44a and 44b. The D input and Q output of this flip-flop are connected to AND gate 45a which is connected to the D input of flip-flop 45. The Q output of flip-flop 45 is connected to the D input of flip-flop 46 via inverters 46a and 46b. The Q output of flip-flop 45 and $\overline{Q}$ output of flip-flop 46 are connected to NAND gate 46c which is connected to a CLR (clear) input of flip-flop 47. The Q output of this flip-flop is connected to counter 50.

The typical application for this circuit is in a telephone switching system. If two such systems communicate over a digital Time Division Multiplexed (TDM) trunk each must have its clock source operating at very close to the same frequency. When the two systems are not operating at precisely the same frequency, some of the information traveling down the trunk is periodically lost in what is called a frame slip. During an outage of the reference clock circuit, the local clock circuit should be relatively stable and should maintain its pre-outage frequency for the duration of the outage. However, it is just as important that synchronism be re-established when the reference clock signal is re-established, in order to minimize any further frequency differences. This circuit provides a novel arrangement for minimizing frequency disturbances to the local clock circuit when phase locking to a reference clock circuit. It also maintains frequency stability of the local clock circuit during an outage.

Under normal conditions the 1.544 MHz reference clock signal appears on the REF CLK lead and is detected by RMM 10. The period of RMM 10 is longer than the 640 millisecond period of the 1.544 MHz clock signal. Consequently, as long as the reference clock signal is not interrupted, RMM 10 is continuously re-triggered before it times out and it therefore applies a logic level 1 CLK DETECTED signal to microprocessor 60.

Under these normal conditions microprocessor 60 applies a digital CONTROL signal to DAC 70 which converts this signal into an analog control signal. This analog control signal is then applied to VCXO 80 which generates a 12.352 MHz local clock signal for use by the local system. This 12.352 MHz signal is counted down to an 8 KHz signal by divider 90 and applied to window circuit 40. The 1.544 MHz reference clock signal is also counted down to an 8 KHz signal by divider 30. Under these normal conditions the LOCAL and REF 8 KHz signals are in phase and a 62.5 microsecond PHASE DIFFERENCE WINDOW signal is provided by window circuit 40. The 12.352 MHz local clock signal is also counted down to a 6.176 MHz signal by divider 100 and applied to the clock input of counter 50. This counter accumulates a numerical value representing the 62.5 microsecond phase difference window and microprocessor 60 interrogates the counter value which is averaged over a period of two seconds. Microprocessor 60 then updates the CONTROL signal applied to DAC 70 at 2 second intervals to cause the 8 KHz counted down local and referenced clock signals to remain locked in phase. Consequently the LOCAL CLK 12.352 MHz and REF CLK 1.544 MHz signals are also locked in phase.

Thus when the present invention operates to phase lock the counted down 8 KHz local and reference signals, it raises or lowers the frequency of the local clock circuit relative to frequency of the reference clock circuit until phase locking of the 8 KHz signals is achieved.

In the event of termination of the reference clock signal, RMM 10 applies a logic level 0 CLK DETECTED signal to microprocessor 60. Microprocessor 60 then loads an internal register with the data required to hold VCXO 80 in its current frequency and phase condition. DAC 70 converts the digital data, from the internal microprocessor register, to the analog signal required to maintain the voltage controlled oscillator in the same frequency and phase state that existed prior to the outage. This state of the oscillator is then held for the duration of the outage. This state can be maintained for a considerable period of time without frame slips if the oscillator has a low natural drift rate. For example, if the natural drift rate is one part in $10^9$ parts, the voltage controlled oscillator would operate for approximately one and one-half days under this hold condition before a frame slip would occur.

When the 1.554 MHz reference clock signal returns after an outage, the reference clock divider is initialized to the same relative count as the local clock divider. In this way, the phase difference between the two counted down clock signals is minimized to the phase difference between the signals that are clocking the counter chains i.e., the local clock signal and the reference clock signal.

When the reference clock signal returns, RMM 10 applies a logic level 1 CLK DETECTED signal to microprocessor 60. Microprocessor 60 then applies an ENABLE signal (duration greater then 125 microseconds but less than 250 microseconds) to the D input of flip-flops 22 and 24 in pulse generator 20. This logic level 1 signal is latched in flip-flops 22 and 24 when they are clocked by the negative going edge of the 1.544 MHz reference and 12.352 MHz local clock signals, respectively. These negative going edges are inverted to positive going edges by inverter 23 and 25 to clock the positive edge triggered flip-flops 22 and 24, respectively. These flip-flops then provide logic level 0 signals on their $\overline{Q}$ outputs. These signals represent the leading edge of negative going load pulses.

When microprocessor 60 removes the ENABLE signal, a logic level 0 signal appears at the D input of flip-flops 22 and 24. This logic level 0 signal is then clocked into these flip-flops on the next negative going edge of the 1.544 MHz reference and 12.352 MHz local clock signals. This results in logic level 1 signals appearing at the $\overline{Q}$ output of flip-flops 22 and 24. These signals represent the positive going trailing edge of the negative going load pulses.

Thus negative going load pulses are applied to the load input of dividers 30 and 90. These dividers are actually loaded on the positive going trailing edge of the associated negative going load pulse. This positive going trailing edge occurs in synchronism with the negative going edge of the reference 1.544 MHz clock signal and local 12.352 MHz clock signal which triggered flip-flops 22 and 24, respectively. Dividers 30 and 90 then begin counting on the next positive going edge of the associated 1.544 MHz reference or 12.352 MHz local clock signals, respectively. Therefore divider 30 begins counting after one-half period of the 1.544 MHz reference signal elapses, or 325 nanoseconds after it is loaded. Similarly, divider 90 begins counting after one-half period of the 12.352 MHz local signal elapses, or 40 nanoseconds after it is loaded.

Dividers 30 and 90 count the reference 1.544 and local 12.352 MHz signals down to the 8 KHz reference and local signals, respectively. Thus, the leading edges of the local and reference 8 KHz signals are brought to within 40 nanoseconds (one-half period times 12.352 MHz) of each other before phase locking even begins.

Window circuit 40 operates to detect the phase difference between the local and reference counted down 8 KHz clock signals. Flip-flops 41–46 in this window circuit are clocked by a 6.176 MHz signal derived from the local clock 12.35 MHz signal via divider 100.

Flip-flop 41 in combination with flip-flop 42, and flip-flop 43 in combination with flip-flop 44, prevent violations of data set up times and thereby eliminate generation of transients and spikes in the phase difference window signal edges. These violations are due to lack of correlation between the 6.176 MHz clock signal and the counted down reference 8 KHz clock signal.

When flip-flops 41 and 43 are clocked, their output state, after the positive clock edge, agrees with the data input if no violation of the data set up time is encountered. Otherwise the output state agrees with the data input on the next clock edge. Flip-flops 42 and 44, assume the same state as flip-flops 41 and 43, respectively, on the next clock pulse. Inverters 41a and 41b, and 44a and 44b provide sufficient hold time for the data inputs of flip-flops 42 and 44 since the minimum delay through two inverters (low power Schottky) equals the minimum hold time in the (Schottky) D type flip-flops.

When the inputs of flip-flops 42 and 44 agree with their outputs, AND gates 42a and 45a produce clean edge signals. The positive going edge of the signal from AND gate 42a is derived from the positive going edge of the counted down 8 KHz reference clock signal, and it is used to generate the leading (positive going) edge of the window signal by causing flip-flop 47 to set. Inverter 47a causes a logic level 1 signal to appear at the D input of flip-flop 47. When the positive going edge of the signal from AND gate 42a appears at the clock input of this flip-flop, it sets and transfers the logic level 1 signal appearing at its D input to its Q output, thereby generating the positive going leading edge of the PHASE DIFFERENCE WINDOW signal.

The positive going edge of the signal from AND gate 45a is derived from the negative going edge of the counted down 8 KHz local clock signal, as inverted by inverter 43a, and it is used to generate the trailing (negative going) edge of the PHASE DIFFERENCE WINDOW signal by causing flip-flop 47 to reset. The logic level 1 signal from AND gate 45a appears at the D input of flip-flop 45. This flip-flop is then set on the next 6.176 MHz clock pulse causing a logic level 1 signal to appear at its Q output. At this time flip-flop 46 is still in the reset state with a logic level 1 signal appearing at its $\overline{Q}$ output. As a result logic level 1 signals appear at both inputs of NAND gate 46c which then applies a logic level 0 signal to the clear (CLR) input of flip-flop 47. This signal causes flip-flop 47 to reset, thereby providing a logic level 0 signal on its Q output. This logic level 0 signal represents the negative going trailing edge of the phase difference window signal.

The logic level 1 signal appearing at the Q output of flip-flop 45 is then applied to the D input of flip-flop 46 via inverters 46a and 46b. One clock pulse later flip-flop 46 is set, in response to this logic level 1 signal, and a logic level 0 signal appears at its $\overline{Q}$ output. This logic level 0 signal causes NAND gate 46c to apply a logic level 1 signal to the CLR input of flip-flop 47, thereby terminating the reset level on the clear input of this flip-flop. NAND gate 46c thus produces a reset pulse that is equal to one period of the 6.176 MHz clock. Inverters 46a and 46b provide the minimum required data hold time for flip-flop 46.

Thus the PHASE DIFFERENCE WINDOW signal generated by flip-flop 47 represents the time interval between the positive going edge of a counted down 8 KHz reference signal and the negative going edge of a counted down 8 KHz local signal. Consequently, when these signals are in phase, this phase difference signal will be 62.5 microseconds long since the phase difference is measured between the leading edge of one 8 KHz signal (125 microsecond period with 50% duty cycle) and the trailing edge of another 8 KHz signal.

The window signal representing the phase difference between the local and reference 8 KHz signals is applied to counter 50. This counter then provides a number representative of the duration of the average window signal. The average window duration is used in order to filter out jitter and other abnormal distortions in the local and reference clock circuit signals.

Microprocessor 60 then subtracts a number representing 62.5 microseconds from this average window signal counter number. This number must be subtracted since even when the two clock signals are in phase, the window signal will show a phase difference of 62.5 microseconds because the phase difference is measured between the leading edge of the reference 8 KHz signal and the trailing edge of the local 8 KHz signal. Such an arrangement facilitates the use of the positive and negative control signals which must be applied by microprocessor 60 to VCXO 80 via DAC 70. These positive and negative control signals are required in order to cause the voltage controlled oscillator to vary the local clock frequency in both positive and negative (higher and lower frequency) directions when adjusting the frequency of the local clock signal in order to lock it in phase with the reference clock signal.

For example, if there is a 100 microsecond window signal, microprocessor 60 subtracts 62.5 microseconds which results in +37.5 microseconds. It then applies a control signal to oscillator 80 which tends to increase the oscillator's frequency in order to reduce this positive phase difference. Alternatively, if there is a 50 microsecond window signal, microprocessor 60 again substracts 62.5 microseconds which results in −12.5 microseconds. It then applies a control signal to oscillator 80 which tends to decrease the oscillator's frequency in order to reduce this negative phase difference.

Counter 50 provides a count or number representative of the average phase difference. The counter is allowed to accumulate a total count for $2^{14}$ windows. Microprocessor 60 then applies a logic level 0 CLEAR signal to this counter in order to clear it. The maximum window signal duration is 125 microseconds, and the counter is clocked by the 6.176 MHz signal. Consequently the maximum window count is 772 (6.176 MHz × 125 microseconds). Therefore, a 10 bit counter is required to store one window count. Since the window count is averaged over $2^{14}$ windows, $2^{14}$ window counts must be accumulated. Therefore counter 50 includes 24 (10+14) counter bits. The average, non-fractional count is then automatically obtained by microprocessor 60 when it retrieves the most significant 10 bits.

For example, if the maximum count is four bits wide the average of 2 counts is to be obtained, then a six bit register is required. If the four successive counts are 1111(15), 1101(13), 1100(12) and 1011(11) then the total binary count equals 110011 and the equivalent total decimal count equals 51. The average decimal count=51/4=12.75 and the average binary count is obtained by shifting the binary point 2 places to the left which results in a binary number 1100.11. By taking the 4 most significant bits only and converting them to decimal we get 8+4=12. Also, by taking the 2 bits after the binary point we get $\frac{1}{2}+\frac{1}{4}=0.75$. The sum of these two numbers equals 12.75 as was determined by a straight decimal conversion. If we add another set of 4 similar values, the number obtained would be 1100.11+1100.11=1100110, and by placing the binary point 3 places to the left ($2^3=8$ values) the average of 8 numbers is obtained. When converting to decimal $1100.110 = 8+4+\frac{1}{2}+\frac{1}{4}=12.75$ as before. Therefore, if the number of windows is a power of 2, i.e. $2^n$, the precise average window value is obtained by placing the binary point "n" places to the left and retrieving all of the counter bits, including the fractional ones. In the present invention the binary point is shifted 14 places ($2^{14}$ windows). Thus by retrieving the 10 most significant bits of the 24 bit counter the non-fractional average of $2^{14}$ counts is obtained. By retrieving more bits fractional precision is added to the average count. In the present invention the 16 most significant bits are retrieved which provides 6 fractional bits. This 16 bit number produces an average that is accurate to within $2^{-6}$ or 1/64 of the actual count. This arrangement reduces microprocessor real time since averaging is performed through shift operations rather than repetitive microprocessor calculations.

Thus the present invention provides a novel arrangement for minimizing local clock frequency disturbances when phase locking it to a reference clock. The pulse generator synchronizes the reference clock frequency divider with the local clock frequency divider when the reference clock signal returns after an outage. The window circuit provides a signal representative of the phase difference between the local and reference clock signals and the counter provides an averaged numerical representation of this signal. The microprocessor retrieves this averaged phase window number and applies a corresponding control signal to the voltage controlled oscillator, via the DAC, to cause it to adjust its frequency to phase lock the two clock circuits. In the event of an outage of the reference clock circuit the microprocessor maintains the last control signal to hold the voltage controlled oscillator at the same frequency that existed prior to the outage.

It will be obvious to those skilled in the art that numerous modifications of the present invention can be made without departing from the spirit of the invention.

What is claimed is:

1. A clock signal phase locking arrangement for use in a switching system which includes a source of reference clock signals, said phase locking arrangement comprising:
a control circuit operative to provide a plurality of local clock frequency control signals, said control circuit being connected to said reference clock signal source and further operative in response to an absence of said reference clock signals for a predetermined time to maintain the local clock frequency control signal in its current state;
a local clock circuit connected to said control circuit and operative in response to said plurality of local clock frequency control signals to provide a plurality of local clock signals, each having a frequency associated with a different one of said control signals;
said control circuit being further operative in response to detection of said reference clock signals after said absence to generate first and second synchronization signals;
a first frequency divider connected to said source of reference clock signals and said control circuit, and operative in response to said first synchronization signal to provide counted down reference clock signals of a characteristic frequency;
a second frequency divider connected to said local clock circuit and said control circuit, and operative in response to said second synchronization signal to provide counted down local clock signals of said characteristic frequency; and
a phase difference measurement circuit, connected to said first and second frequency dividers, and said control circuit, and operative in response to said counted down reference clock signals and said counted down local clock signals to provide a phase difference signal representative of the phase difference between each of said counted down reference clock signals and an associated one of said counted down local clock signals;
said control circuit being further operative in response to each of said phase difference signals to provide an associated one of said control signals of a characteristic representative of the duration of said phase difference signal, whereby the frequency of said local clock circuit is adjusted to eliminate the difference in phase between said counted down local clock signals and said counted down reference clock signals.

2. A phase locking arrangement as claimed in claim 1, wherein said local clock circuit comprises:
a voltage controlled oscillator.

3. A phase locking arrangement as claimed in claim 1, wherein said first frequency divider is initialized to a predetermined count in response to said synchronization signal.

4. A phase locking arrangement as claimed in claim 1, wherein said second frequency divider is initialized to a predetermined count in response to said synchronization signal.

5. A phase locking circuit as claimed in claim 1, wherein said phase difference measurement circuit comprises:
a first timing circuit connected to said first frequency divider and operative in response to said counted down reference clock signals to provide a phase window initiation signal;
a second timing circuit connected to said second frequency divider and operative in response to said counted down local clock signals to provide a phase window termination signal;
signalling means connected to said first and second timing circuits and operative in response to said phase window initiation signal to provide the leading edge of said phase difference signal and further operative in response to said phase window termination signal to provide the trailing edge of said phase difference signal.

6. A phase locking circuit as claimed in claim 5, wherein a source of trigger signals is further included and said first timing circuit comprises:

a first storage means connected to said first frequency divider and said trigger signal source, and operative in response to said counted down reference clock signal and a first trigger signal to provide a first storage signal;

second storage means connected to said first storage means and said trigger signal source, and operative in response to said first storage signal and a second trigger signal to provide a second storage signal; and first gating means connected to said first and second storage means ad operative in response to said first and second storage signals to provide said phase window initiation signal.

7. A phase locking circuit as claimed in claim 6, wherein said first storage means comprises a D-type flip-flop.

8. A phase locking circuit as claimed in claim 7, wherein said first storage means further comprises a delay circuit connected to said D-type flip-flop.

9. A phase locking circuit as claimed in claim 8, wherein said delay circuit comprises a pair of series connected inverters.

10. A phase locking circuit as claimed in claim 6, wherein said second storage means comprises a D-type flip-flop.

11. A phase locking circuit as claimed in claim 5, wherein a source of trigger signals is further included and said second timing circuit comprises:

first storage means connected to said second frequency divider and said trigger signal source, and operative in response to said counted down local clock signal and a first trigger signal to provide a first storage signal;

second storage means connected to said first storage means and said trigger signal source and operative in response to an absence of said first storage signal to provide a second storage signal;

first gating means connected to said first and second storage means, and operative in response to said first and second storage signals to provide the leading edge of said phase window termination signal;

said second storage means being further operative in response to said first storage signal and a second trigger signal to provide a third storage signal;

said first gating means being further operative in response to said first and third storage signals to provide the trailing edge of said phase window termination signal.

12. A phase locking circuit as claimed in claim 5, wherein a source of trigger signals is further included and said second timing circuit comprises:

first storage means connected to said second frequency divider and said trigger signal source, and operative in response to said counted down local clock signal and a first trigger signal to provide a first storage signal;

second storage means connected to said first storage means and said trigger signal source, and operative in response to said first storage signal and a second trigger signal to provide a second storage signal;

first gating means connected to said first and second storage means and operative in response to said first and second storage signals to provide a first gating signal;

third storage means connected to said first gating means and said trigger signal source, and operative in response to said first gating signal and a third trigger signal to provide a third storage signal;

fourth storage means connected to said third storage means and said trigger signal source and operative in response to an absence of said third storage signal to provide a fourth storage signal; and second gating means connected to said third and fourth storage means and operative in response to said third and fourth storage signals to provide the leading edge of said phase window termination signal;

said fourth storage means being further operative in response to said third storage signal and a fourth trigger signal to provide a fifth storage signal;

said second gating means being further operative in response to said third and fifth storage signals to provide the trailing edge of said phase window termination signal.

13. A phase locking circuit as claimed in claim 12, wherein said first storage means comprises a D-type flip-flop.

14. A phase locking circuit as claimed in claim 13, wherein said first storage means further comprises a delay circuit connected to said D-type flip-flop.

15. A phase locking circuit as claimed in claim 14, wherein said delay circuit comprises a pair of inverters.

16. A phase locking circuit as claimed in claim 13, wherein said first storage means further comprises an inverter connected between said D-type flip-flop and said second frequency divider.

17. A phase locking circuit as claimed in claim 12, wherein said second storage means comprises a D-type flip-flop.

18. A phase locking circuit as claimed in claim 12, wherein said third storage means comprises a D-type flip-flop.

19. A phase locking circuit as claimed in claim 12, wherein said fourth storage means comprises a D-type flip-flop.

20. A phase locking circuit as claimed in claim 12, wherein said fourth storage means further comprises a delay circuit connected between said third and fourth storage means.

21. A phase locking circuit as claimed in claim 20, wherein said delay circuit comprises a pair of inverters.

22. A phase locking circuit as claimed in claim 5, wherein said signalling means comprises a storage circuit.

23. A phase locking circuit as claimed in claim 22, wherein said storage circuit comprises a D-type flip-flop having a clock input connected to said first timing circuit and a clear input connected to said second timing circuit.

24. A phase locking circuit as claimed in claim 6, wherein said source of trigger signals comprises a voltage controlled oscillator and a third frequency divider connected to said oscillator.

25. A phase locking circuit as claimed in claim 12, wherein said source of trigger signals comprises a voltage controlled oscillator and a third frequency divider connected to said oscillator.

26. A phase locking circuit as claimed in claim 1, wherein said control circuit comprises:
- a source of trigger signals and a counter connected to both said phase difference measurement circuit and said source of trigger signals;
- said counter being operative to count said trigger signals for the duration of each of a predetermined number of phase difference signals and to provide a number representative of the total number of such trigger signals counted;
- a microprocessor connected to said counter and said local clock circuit and operative in response to a predetermined number of local clock signals equal to said predetermined number of phase difference signals, to retrieve said number from said counter and to determine the average number of trigger signals counted for each phase difference signal;
- said microprocessor being further operative in response to said average number being above or below a predetermined threshold to provide an associated positive or negative number; and
- a digital-to-analog converter connected to said microprocessor and operative in response to each of said positive and negative numbers to provide an associated local clock frequency control signal.

27. A phase locking circuit as claimed in claim 1, wherein said control circuit comprises:
- pulse detection means connected to said source of reference clock signals, and operative in response to detection of said reference clock signals to provide a reference clock detected signal, and further operative in response to detection of an absence of said reference clock signals for said predetermined time to provide a reference clock failure signal;
- processing means connected to said pulse detection means and operative in response to said reference clock failure signal to maintain the local clock frequency control signal in its current state;
- said processing means being further operative in response to said reference clock detected signal to provide an enable signal; and
- pulse generating means connected to said processing means, said local clock circuit and said source of reference clock signals, and operative in response to said enable signal and said reference clock signals to provide said first synchronization signal, and further operative in response to said enable signal and said local clock signals to provide said second synchronization signal.

28. A phase locking circuit as claimed in claim 27, wherein said pulse detection means comprises a retriggerable monostable multivibrator.

29. A phase locking circuit as claimed in claim 27, wherein said pulse generating means comprises:
- a first D-type flip-flop having a first output, a first data input and a first clock input, said first data input being connected to said processing means, said first clock input being connected to said source of reference clock signals, and said first output being connected to said first frequency divider; and
- a second D-type flip-flop having a second output, a second data input and a second clock input, said second data input being connected to said processing means, said second clock input being connected to said local clock circuit, and said second output being connected to said second frequency divider.

30. A phase locking circuit as claimed in claim 29, wherein a first inverter is included between said source of reference clock signals and said first clock input and a second inverter is included between said local clock circuit and said second clock input.

* * * * *